(12) United States Patent
Johansson et al.

(10) Patent No.: US 6,190,759 B1
(45) Date of Patent: Feb. 20, 2001

(54) HIGH OPTICAL CONTRAST RESIN COMPOSITION AND ELECTRONIC PACKAGE UTILIZING SAME

(75) Inventors: Gary A. Johansson, Vestal; Konstantinos I. Papathomas, Endicott, both of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/025,513

(22) Filed: Feb. 18, 1998

(51) Int. Cl.⁷ ............................. B32B 3/00; H05K 1/00
(52) U.S. Cl. .......................... 428/209; 428/901; 174/258
(58) Field of Search .................... 428/209, 901; 174/258

(56) References Cited

U.S. PATENT DOCUMENTS

| | | |
|---|---|---|
| 3,681,292 | 8/1972 | Loudas et al. . |
| 4,195,132 | 3/1980 | Sundermann et al. ............... 528/225 |
| 4,326,239 | 4/1982 | Ohsawa et al. ...................... 361/410 |
| 4,477,629 | 10/1984 | Hefner, Jr. et al. .................. 525/113 |
| 4,489,202 | 12/1984 | Hefner, Jr. et al. .................... 528/95 |
| 4,546,131 | 10/1985 | Hefner, Jr. et al. .................. 523/466 |
| 4,680,341 | 7/1987 | Newman-Evans ................... 525/113 |
| 4,697,923 * | 10/1987 | Jones et al. .......................... 361/411 |
| 4,740,584 | 4/1988 | Shimp .................................. 528/422 |
| 4,745,215 | 5/1988 | Cox et al. ............................ 528/422 |
| 4,894,790 | 1/1993 | Yotsuya et al. ..................... 364/552 |
| 4,943,606 | 7/1990 | Inoue et al. .......................... 523/457 |
| 5,103,293 * | 4/1992 | Bonafino et al. .................... 174/256 |
| 5,216,047 | 6/1993 | Kato et al. ........................... 523/506 |
| 5,302,627 * | 4/1994 | Field et al. ............................. 522/13 |
| 5,314,950 | 5/1994 | Singh et al. ........................... 525/73 |
| 5,326,671 | 7/1994 | Brown et al. ........................ 430/311 |
| 5,518,656 | 5/1996 | Furuta et al. .................... 252/301.19 |

FOREIGN PATENT DOCUMENTS

| | | |
|---|---|---|
| 1-313575 | 12/1989 | (JP) . |
| 5-247301 | 9/1993 | (JP) . |
| 6-329880 | 11/1994 | (JP) . |
| 7-500618 | 1/1995 | (JP) . |
| 11-61115 | 3/1999 | (JP) . |

OTHER PUBLICATIONS

"Colorants for Plastics" by Kreschwitz et al in Encyclopedia of Chemical Technology, vol. 6, pp. 944–965 Wiley, New York, 1993 (no month).

* cited by examiner

*Primary Examiner*—Cathy F. Lam
(74) *Attorney, Agent, or Firm*—Pollock, Vande Sande & Amernick; Lawrence R. Fraley

(57) ABSTRACT

A composition for use in making high optical contrast and UV light fluorescing dielectric material usuable in printed circuit boards, which in turn may form part of an electronic package. The composition comprises a resin, a coloring agent, and a fluorescing agent. A dielectric material is also defined that comprises a reinforcing material combined with the composition, the dielectric material forming at least one layer in combination with at least one conductive layer for the electronic package.

15 Claims, No Drawings

HIGH OPTICAL CONTRAST RESIN COMPOSITION AND ELECTRONIC PACKAGE UTILIZING SAME

TECHNICAL FIELD

This invention relates to a high optical contrast and UV fluorescing composition such as may be used in dielectric layers of printed circuit boards, said boards in turn forming part of an electronic package.

BACKGROUND OF THE INVENTION

In the manufacture of electronic devices, such as computers, printed circuit boards are widely used to support discrete electronic components and to provide the electrical circuitry between the components. Commercial electronic computers have become much more powerful since the introduction thereof, yet these have been reduced in physical dimensions from room size to notebook size. As this size has decreased and the number of interconnections due to more powerful logic has increased, the printed circuit boards used therein have become denser and more complex. Today's printed circuit boards can be extremely dense, with very small geometries and with many layers.

Typically, printed circuit boards have at least one central core, typically a dielectric layer, such as a composite of fiber glass and a thermosetting resin such as an epoxy resin, which core has applied on at least one surface thereof a layer of conductive material such as copper. The layer or layers of conductive material are etched or otherwise processed to provide circuits of predetermined geometrical configuration. Several such cores may then be laminated to form a multi-layered structure (a printed circuit board) having metal circuitry sandwiched between dielectric layers.

The dielectric material widely used today contains a composition of epoxy resins impregnated onto glass or fiber-glass reinforcing material. The dielectric layers within these circuit boards exhibit the color of the epoxy, typically white or yellow. Printed circuit boards with dielectric surfaces and layers having a white or yellow color afford low optical contrast when compared with the circuitry and make automated optical assembly pick and place operations (where components are positioned on and eventually coupled to the circuitry) very difficult.

Additionally, in the likely event that the printed circuit boards made from these dielectric layers require inspection, low optical contrast between the dielectric material and circuitry on any one layer of the printed circuit board also makes inspection difficult and inefficient. For example, circuitry defects adjacent the dielectric material on a printed circuit board with low optical contrast are difficult to optically inspect and make the process of inspecting very time consuming.

Electrical techniques to detect such circuit defects are also not effective because high electrical conductivity metals are used in circuitizing printed circuit boards. Detecting a change in current flow through a highly conductive metal circuit having a small defect is very difficult, if not impossible, without very sophisticated techniques.

To solve these foregoing and related problems, an improved composition for making a dielectric layer has been developed. It is believed that such a composition and the resultant electronic package, will constitute a significant advancement in the art.

OBJECTS AND SUMMARY OF THE INVENTION

Accordingly, it is the object of this invention to provide a new and unique composition which in turn may form part of a dielectric layer of an electronic package.

Another object of this invention is to provide a method of making such a composition.

Yet another object of this invention is to provide an electronic package including a dielectric layer of reinforcing material, a resin, a coloring agent and a fluorescing agent, the dielectric layer having enhanced ultraviolet (UV) light fluorescence characteristics and enhanced optical contrast which allows both more efficient and accurate inspection of the layer, e.g., when used in a printed circuit board.

The invention is adaptable to mass production, improves overall product quality and reduces the cost of manufacturing such products.

BEST MODE FOR CARRYING OUT THE INVENTION

In accordance with the teachings of this invention, there is provided a new composition for use in the manufacture of a circuitized substrate, (e.g., printed circuit board or chip carrier) usable as part of an electronic package. In one embodiment, this composition comprises a resin material, a coloring agent, and a fluorescing agent. It has been discovered that when this composition is utilized in the manufacture of a printed circuit board, it results in a printed circuit board dielectric layer having UV light absorbing fluorescing characteristics. As a result, the metallic conductor patterns on the printed circuit board (which do not have UV fluorescing characteristics) can be more readily, efficiently, and accurately inspected when the printed circuit board is irradiated with UV light. One application of this invention is manifested by comparing the UV light fluorescence pattern generated from a defective circuit pattern of a printed circuit board manufactured with the composition of this invention to the UV light fluorescence pattern generated from a defect free circuit pattern of a printed circuit board also manufactured with the composition of this invention. In addition, assembly processes such as those required when picking and placing components on a circuit board require high optical contrast surfaces for efficient optical equipment functionality. It has been discovered that printed circuit boards or chip carriers manufactured with the composition of this invention provide a laminate with color and high optical contrast surfaces which improve the assembly apparatus pick and place capability. The resin material of this invention is selected from a group including epoxy, cyanate or bismaleimide resins or combinations thereof. Examples of epoxy resins used in this invention include epoxy polymer resins such as epoxidized novolac polymers and polyepoxides from haloepoxy alkane polymers derived from mononuclear and polynuclear dihydric and halogenated dihydric phenols. Mixtures of epoxides can also be used. Further examples of suitable epoxides containing an oxirane ring that can be employed are known and are described in E. W. Flick, "Epoxy Resin, Curing Agents, Compounds, and Modifiers" Noyes Publications, Park Ridge, N.J. (1987); in Lee and Neville, "Epoxy Resins" McGraw-Hill, (1967) and in U.S. Pat. No. 4,680,341.

Epoxidized novolac polymers are commercially available and can be prepared by known methods by the reaction of an uncrosslinked aldehyde of a phenol with a haloepoxy alkane. The phenol can be a mononuclear or polynuclear phenol. Examples of mononuclear phenols have the formula:

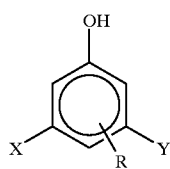

wherein X, Y, and R are independently selected from the group hydrogen or hydrogen alkyl containing 1 to 9 carbon atoms, aryl containing 6 to 14 carbon atoms, and halogen. Hydrocarbon substituted phenols having two available positions ortho (o) or para (p) to a phenolic hydroxy group for aldehyde condensation to provide polymers suitable for the preparation of epoxy novolacs include o- and p-cresols, o- and p-isopropyl phenols, o- and p-tert-butyl phenols, o- and p- sec-butyl phenols, o- and p-amyl phenols, o- and p-octyl phenols, o- and p-nonyl phenols, 2,5-xylenol, 3,4-phenol, 2,5-diethyl phenol, 3,4-diethyl phenol, 2,5-diisopropyl phenol, o- and p-benzyl phenol, o- and p-phenylphenols, o- and p-tolyl phenols, o- and p-xylyl phenols, o- and p-cyclohexyl phenols, and o- and p-cyclopentyl phenols.

Various chloro-substituted phenols which can be used in the preparation of phenol-aldehyde resins suitable for the preparation of the epoxy novolacs include o- and p-chlorophenols, 2,5-dichlorophenol, 2,3-dichlorophenol, 3,4-dichlorophenol, 2-chloro-3-methylphenol, 2-chloro-5-methylphenol, 3-chloro-2-methylphenol, 5-chloro-2-methylphenol, 3-chloro-4-methylphenol, 4-chloro-3-methylphenol, 4chloro-3-ethylphenol, 4-chloro-3-isopropylphenol, 3-chloro-4-phenylphenol, 3-chloro-4-chlorophenylphenol, 3,5-dichloro-4-methylphenol, 3,5-dichloro-2-methylphenol, 2,3-dichloro-5-methylphenol, 2,5-dichloro-3-methylphenol, 3-chloro-4,5-dimethylphenol, 4chloro-3,5-dimethylphenol, 2-chloro-3,5-dimethylphenol, 5-chloro-2,3-dimethylphenol, 5-chloro-3,5-dimethylphenol, 2,3,5-trichlorophenol, 3,4,5-trichlorophenol.

Typical phenols which have more than two positions ortho or para to a phenolic hydroxy group available for aldehyde condensation and which, by controlled aldehyde condensation, can also be used are: phenol, m-cresol, 3,5-xylenol, m-ethyl, and m-isopropyl phenols, m,m'-diethyl and diisopropyl phenols, m-butyl phenols, m-amyl phenols, m-octyl phenols, m-nonyl phenols, resorcinol, 5-methyl resorcinol, 5-ethyl resorcinol.

As condensing agents, any aldehyde or ketone may be used which will condense with the particular phenol being used, including formaldehyde, acetaldehyde, propionaldehyde, butyraldehyde, heptaldehyde, cyclohexanone, methyl cyclohexanone, cyclopentanone, benzaldehyde, and alkyl substituted benzaldehydes, such as toluic aldehyde, naphthaldehyde, furfuraldehyde, glyoxal, acrolein, or compounds capable of engendering aldehydes such as para-formaldehyde and hexamethylene tetramine. The aldehydes can also be used in the form of a solution, such as the commercially available formalin. The preferred aldehyde is formaldehyde. Examples of polynuclear dihydric phenols are those having the formula:

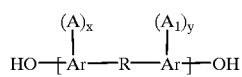

wherein Ar is an aromatic hydrocarbon such as naphthylene and, preferably, phenylene: A and Al can be the same or different are alkyl radicals, preferably including from 1 to 4 carbon atoms, halogen atoms, i.e., fluorine, chlorine, bromine, and iodine, or alkoxy radicals, preferably having from 1 to 4 carbon atoms; x and y are integers having a value 0 to a maximum value corresponding to the number of hydrogen atoms on the aromatic radical (Ar) which can be replaced by substituents and R is a bond between adjacent carbon atoms as in dihydroxydiphenyl or is a divalent radical including, for example:

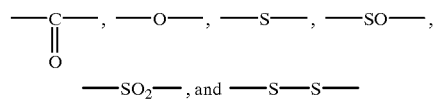

and divalent hydrocarbon radicals, such as alkylene, alkylidene, cycloaliphatic, e.g., cycloalkylene and cycloalkylidene, halogenated, alkoxy or aryloxy substituted alkylene, alkylidene and cycloaliphatic radicals, as well as alkarylene and aromatic radicals including halogenated, alkyl, alkoxy, or aryloxy substituted aromatic radicals and a ring fused to an Ar group or R can also be polyalkoxy, or polysiloxy, or two or more alkylidene radicals separated by an aromatic ring, a tertiary amino group, an ether linkage, a carbonyl group or a sulfur containing group such as sulfoxide, and the like.

Examples of specific dihydric polynuclear phenols include, among others, the bis(hydroxyphenyl)alkanes such as 2,2'-bis(4-hydroxyphenyl)propane, 2,4'-dihydroxydiphenylmethane, bis(2-hydroxy)phenylmethane, bis(4-hydroxyphenyl)methane, bis(4-hydroxy-2,6-dimethyl-3-methoxyphenyl)methane, 1,1'-bis(4-hydroxyphenyl)ethane, 1,2'-bis(4-hydroxyphenyl)ethane, 1,1'-bis(4-hydroxy-2-chlorophenyl)ethane, 1,1'-bis(3-methyl-4-hydroxyphenyl)ethane, 1,3'-bis(3-methyl-4-hydroxyphenyl)propane, 2,2'-bis-(3-phenyl-4-hydroxyphenyl)propane, 2,2'-bis(3-isopropyl-4-hydroxyphenyl)propane, 2,2'-bis(2-isopropyl-4-hydroxyphenyl)pentane, 2,2'-bis(4-hydroxyphenyl)heptane, bis(4-hydroxyphenyl)phenyl methane, bis(4-hydroxyphenyl)cyclohexylmethane, 1,2'-bis(4-hydroxyphenyl)-1,2'-bis(phenyl)propane and 2,2'-bis(4-hydroxyphenyl)-1-phenyl-propane; dihydroxyphenyl sulfones such as bis(4-hydroxyphenyl)sulfone, 5'-chloro-2, 4'-dihydroxydiphenyl sulfone, and 5'chloro-4,4'-dihydroxydiphenyl sulfone; dihydroxyphenyl ethers such as bis(4-hydroxyphenyl)ether, the 4,2'-, 2,2'-, 2,3'-dihydroxydiphenyl ethers, 4,4'-dihydroxy-2,6-dimethyldiphenyl ether, bis(4-hydroxy-3-isobutylphenyl) ether, bis(4-hydroxy-3-isopropylphenyl)ether, bis(4-hydroxy-3-chlorophenyl)ether, bis(4-hydroxy-3-fluorophenyl)ether, bis(4-hydroxy-3-bromophenyl)ether, bis (4-hydroxynaphthyl)ether, bis(4-hydroxy-3-chloronaphthyl) ether, 4,4'-dihydroxy-2,6-dimethoxydiphenyl ether, and 4,4'-dihydroxy-2,5-diethoxydiphenyl ether.

The preferred dihydric polynuclear phenols are represented by the formula:

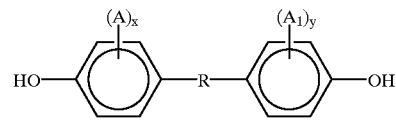

where A and $A_1$ are as previously defined, x and y have values from 0 to 4 inclusive and R is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol A, i.e. 2,2'-bis(p-hydroxyphenyl)propane.

The halogenated epoxy polymers are known and commercially available. Such can be obtained by reacting a brominated bisphenol such as tetrabrominated bisphenol A with a haloepoxy alkane. The haloepoxyalkane can be represented by the formula:

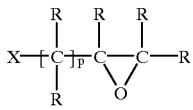

wherein X is a halogen atom (e.g., chlorine, bromine, and the like), p is an integer from 1–8, each R individually is hydrogen or alkyl group of up to 7 carbon atoms and wherein the number of carbon atoms in any epoxy alkyl group totals no more than 10 carbon atoms. The preferred haloepoxy alkane is epichlorohydrin. Of course, mixtures of any of the above polyepoxides can be employed, if desired.

While glycidyl ethers, such as derived from epichlorohydrin, are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxypropane, 1-bromo-2,3-epoxypentane, 2-chloromethyl-1,2-epoxybutane, 1-bromo-4-methyl-3,4-epoxypentane, 1-bromo-4ethyl-2,3-epoxypentane, 4-chloro-2-methyl-2,3-epoxypentane, 1-chloro-2,3-epoxy-octane, 1-chloro-2-methyl-2,3-epoxyoctane, or 1-chloro-2,3-epoxydecane.

Although it is possible to use haloepoxyalkanes having a greater number of carbon atoms than indicated above, there is generally no advantage in using those having a total of more than 10 carbon atoms.

Typical commercially available epoxidized novolac polymers suitable for use in the present invention are ECN 1235, ECN 1278, ECN 1280, and ECN 1299, available from Ciba Corporation; Epon 1031, Epon SU-3, Epon SU-8, and Epon 160 from Shell Chemical Corporation; and DEN 431, DEN 438 and DEN 485 from Dow Corporation.

Typical commercially available diglycidyl ether polyepoxides suitable for use in the present invention are: Araldite GY 6008 and Araldite GY 6010, available from Ciba Corp; Epon 826, Epon 828, Epon 830 and Epon 834 available from Shell Chemical Corporation; DER 331, DER 332, and DER 334 from Dow Corporation.

Typical commercially available brominated epoxy resins suitable for use in the present invention include Araldite LZ 9302, Araldite LZ 8001, Araldite LT 8049, and Araldite AER 8018, available from Ciba Corporation and Epon 1163 and Epon 1183 available from Shell Chemical Corporation.

In addition, the polyepoxides of haloepoxy alkane of the type discussed above and a polynuclear dihydric phenol of the type above can be employed. The preferred polyepoxides of this class are the polyepoxides of epichlorohydrin and bisphenol A such as 2,2'-bis(p-hydroxyphenyl)propane.

Examples of cyanate resins used in this invention include polyfunctional cyanate ester monomers having the formula R—(O—C≡N)$_m$, where m=2–5 and R is an aromatic organic group, the cyanate groups being bonded to an aromatic ring of the aromatic organic group. A more detailed description of the various cyanate esters which can be utilized in the composition of this invention is described herein.

The cyanate esters can be monomeric or preferably polymeric, including oligomers and can be represented by those materials containing the following group:

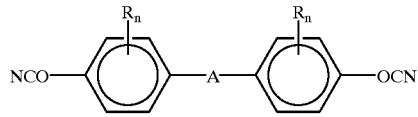

where A represents independently a single bond, —S—, —S—S—, —SO—, —SO$_2$—, —CO—, —CO$_2$—, —O—, —C(CH$_3$)$_2$—; divalent alkylene radicals substituted with heteroatoms such as O, S and N; divalent alkylene radicals interrupted by heteroatoms in the chain such as O, S, and N; and divalent cyclic alkylene groups.

Each R is independently selected from the group of hydrogen alkyl containing 1 to 9 carbon atoms, aryl containing 6 to 14 carbon atoms, alkaryl containing 6–14 carbon atoms, and halogen. Each n independently is an integer of 0 to 4.

Specific cyanate esters that can be employed in the present invention are available and known and include those discussed in U.S. Pat. Nos.: 4,195,132; 3,681,292; 4,740,584; 4,745,215; 4,477,629; and 4,546,131, the disclosures of which are incorporated herein by reference. Some examples of suitable cyanate esters are 4,4'-dicyanatodiphenyl, 2,2'-dicyanatodiphenyl, 3,3',5,5'-tetramethyl-4,4'-dicyanatodiphenyl, 3,3',5,5'-tetrachloro-4,4'-dicyanatodiphenyl, 3,3',5,5'-tetrachloro-2,2'-dicyanatodiphenyl, 2,2',5,5'-tetrachloro-4,4'-dicyanatodiphenyl, 4,4'-bis[(3-cyanato)phenoxy]diphenyl, 4,4'-bis[(4cyanato)phenoxy]diphenyl; 2,2'-dicyanato-1,1'-binaphthyl; 4,4'-dicyanatodiphenyl ether, 3,3',5,5'-tetramethyl-4,4'-dicyanatodiphenyl ether, 3,3'5,5'-tetrachloro-4,4'-dicyanatodiphenyl ether, 4,4'-bis[p-cyanatophenoxy]diphenyl ether, 4,4'-bis(p-cyanato) phenylisopropyl diphenyl ether, 4,4'-bis[p-cyanatophenoxy] benzene, 4,4'-bis[4-(4-cyanatophenoxy)phenyl sulphone] diphenyl ether; 4,4'-dicyanatodiphenylsulphone, 3,3',5,5'-tetramethyl-4,4'-dicyanatodiphenylsulphone, 3,3'5,5'-tetrachloro-4,4'-dicyanatodiphenylsulphone, 4,4'-bis[(p-cyanatophenyl)isopropyl]diphenyl sulphone, 4,4'-bis[(4cyanato)phenoxy]diphenyl sulphone, 4,4'-bis[(3-cyanato)phenoxy]diphenyl sulphone, 4,4'-bis[4-(4-cyanatophenylisopropyl)phenoxy]diphenyl sulphone, 4,4'-bis[(4-cyanatophenyl sulphone)phenoxy]diphenyl sulphone, 4,4'-bis[4-(4-cyanato)diphenoxy]diphenylsulphone, 4,4'-dicyanatodiphenyl sulfide, 4,4'-dicyanatodiphenyl methane, 4,4'-bis(p-cyanatophenyl)diphenyl methane, 2,2'-bis(p-cyanatophenyl)propane, 2,2'-bis(3,5-dimethyl-4-cyanatophenyl)propane, 2,2'-bis(3,5-dichloro-4-cyanatophenyl)propane, 1,1'-bis(p-cyanatophenyl)cyclohexane, bis(2-cyanato-1-naphthyl)methane, 1,2-bis(p-cyanatophenyl)-1,1',2,2'-tetramethylethane, 4,4'-dicyanatobenzophenone, 4,4'-bis(4-cyanato)phenoxybenzophenone, 1,4-bis[(p-cyanatopheny)lisopropyl]benzene, 2,2',5,5'-tetracyanatodiphenyl sulphone; 2,2'-bis(p-cyanatophenyl)hexafluoropropane; polycyanic acid esters of novolacs (reaction products of phenol or alkyl—or halogen substituted phenols with formaldehyde in acid solution) having from 3 to 5 OCN groups. Preferably, prepolymers including oligomers are employed as the cyanate esters. An example of a suitable polyaromatic cyanate ester containing cycloaliphatic bridging group between aromatic rings is available from Dow Chemical Company under the designation Dow XU-71787.00L cyanate. The preferred polyfunctional cyanate esters are: bisphenol AD dicyanate (4,4'-ethylidene bisphenol dicyanate) commercially available as AroCy-L10 from Ciba Corporation, hexafluorobisphenol A dicyanate commercially available as AroCy-F40S from Ciba Corporation, and bisphenol M dicyanate commercially available as RTX-366, REX-378, REX-379, bisphenol A dicyanate under the designations AroCy B-10, B-30, B40S and B50 all from Ciba Corporation.

In addition, the cyanate esters used herein can be blended with organic monomers or polymers including oligomers. The polymers can be thermoplastic or thermosetting. Examples of organic modifiers are epoxies, alkylesters, acetylene terminated resins, multifunctional maleimide resins, monofunctional or multifunctional phenols, polyols, polyetherimides, polyimides, polyimidesiloxanes, fluorine containing polyimides, polyesters, polyacrylates, polysulfones, polyethersulfones, polycarbonates, polyestercarbonates and acrylonitrile-butadiene-styrene polymers.

The bismaleimide resins used in this invention are comprised of polyfunctional maleimide resins. Some examples of these resins are 1,3- or 1,4-dimaleimide benzene, 1,3- or 1,4-bis(maleimide methylene)benzene, 1,3- or 1,4-dimaleimide cyclohexane, 1,3- or 1,4-bis(maleimide methylene)cyclohexane, 4,4'-dimaleimide biphenyl, bis(4-maleimidephenyl)methane, bis(4-maleimidephenyl)ether, bis(4-maleimidephenyl)sulfone, bis(4-maleimide-3-methylphenyl)methane, bis(4-maleimide-3-chlorophenyl)methane, bis(4-maleimide-3,5-dimethylphenyl)methane, 2,2'-bis(4-maleimide-3-methyphenyl)propane, 2,2'-bis(4-maleimide-3,5-dibromophenyl)propane, bis(4-maleimidephenyl)phenylmethane, 3,4-dimaleimidephenyl-4'-maleimidephenylmethane, 1,1'-bis(4-maleimidephenyl)-1-phenylmethane, and maleimide derived from melamine and the addition product of formaldehyde and aniline in which the benzene rings of two or more anilines bond through a methylene group.

Examples of representative maleimides are commercially available and can be represented by the following structural formula:

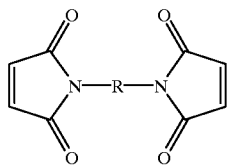

wherein R is a difunctional alkylene radical such as —(CH$_2$—)$_n$ and/or as divalent arylene groups such as

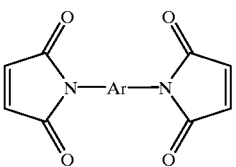

Most preferably the bismaleimide resin employed in this invention is methylene dianiline bismaleimide represented by the formula:

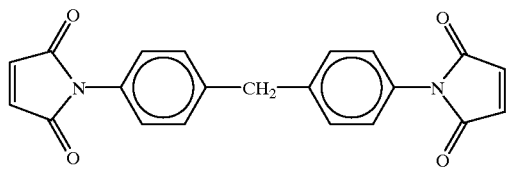

When a maleimide resin is employed, it is desirable to employ a heat-sensitive free radical initiator in order to facilitate the curing. Suitable free radical initiators include peroxides such as dicumyl peroxide and tert-butyl perbenzoic peroxide and azobisisobutyronitrile. When employed, the free radical initiator is present in amounts up to about 0.5 percent by weight and preferably about 0.005 percent to about 0.2 percent by weight based upon the amount of maleimide resin in the composition. Commercial biscyanate/bismaleimide mixtures are known as BT resins, and are available from Mitsubishi Gas Chemical Co. Inc., Japan. One such BT resin is marketed by Mitsubishi under the product name MGC 2060B.

The composition of this invention requires resin material content to be about 78 percent to about 98 percent by weight of the composition. Further, it has been found that various mixtures of resins including combinations of epoxy-cyanate, epoxy-bismaleimide, cyanate-bismaleimide, and epoxy-cyanate-bismaleimide can be used in the practice of this invention. The preferred composition of this invention comprises a resin mixture of about 30 percent to about 70 percent by weight of epoxy resin, about 30 percent to about 70 percent by weight of cyanate resin, and about 2 percent to about 20 percent by weight of bismaleimide resin.

The coloring agent of the composition can be selected from any number of agents such as organic dyes, organic pigments and inorganic pigments. The coloring agent is selected so as not to degrade the performance and properties of the articles fabricated from the composition.

Incorporation of a coloring agent in the composition of this invention imparts good optical properties, and should have minimal deleterious impact on mechanical, chemical, thermal and/or electrical properties. Furthermore, the coloring agent should exhibit thermal and chemical stability toward various processes used in the fabrication of laminates and printed circuit boards. A discussion of coloring agents selected from organic dyes and organic and inorganic pigments can be found in Beebe, G., "Colorants for Plastics" in Encyclopedia of Chemical Technology, Fourth Edition, J. Kroschwitz and M. Howe-Grant Editors, Wiley, New York, 1993, Vol.4, p. 944. One example of an available organic dye coloring agent is marketed by Ciba Corporation under the product name Orasol Black RLI. Other examples of organic dye coloring agents include Bayer Macrolex Yellow 6G and Bayer Macrolex Blue RR, available from Bayer Corporation. The preferred coloring agents used in the composition of this invention are the above three. The composition of this invention requires the coloring agent be present in the range of about 0.01 percent to about 10 percent by weight of the composition.

The composition requires a UV light absorbing fluorescing agent in the range of about 0.01 percent to about 12 percent by weight of the invented composition. Types of fluorescing agents which can also be used in the practice of this invention are selected from the class of fluorescent dyes and pigments including compounds such as benzoxazoles, pyrazolines, stilbenes, and aminocoumarins. A tetrafunctional epoxy resin with enhanced fluorescing characteristics has been shown to be particularly useful and preferred in the practice of this invention. Such a tetrafunctional epoxy resin is marketed by Shell Chemical Corporation under the trademark name Epon 1031. Tetrafunctional epoxy resin is also marketed by Ciba Corporation under the product name MT 0163. The compositions as defined above are preferably used to form a dielectric material which may then be combined with suitable reinforcing material (see below) to form the dielectric portion of a substrate such as used in a printed circuit board. Such a substrate may include several layers of such material, in addition to corresponding conductive layers which may serve as signal, power and/or ground layers.

Therefore, in accordance with the teachings of this invention, there is also provided an electronic package which includes a dielectric layer formed from the above composition and at least one conductive layer positioned on or within the dielectric layer. The conductive layers of the package, preferably electrically conductive, are comprised of copper and are circuitized (e.g., by photolithographic processes known in the art). Further, it should be understood that this package could include additional layers of dielectric material such as those described herein, or layers such as those of a photoimageable dielectric material having internal vias or apertures either filled with electrically conductive material or plated and connected to the electrically conductive layers. It is also possible that this package could include through holes either plated or filled with electrically conductive material so as to electrically connect internal layers of electrically conductive material or circuitry with external layers of electrically conductive material.

The reinforcing material of this electronic package can be selected from the group of organic woven fibers, organic non-woven fibers, inorganic woven fibers or inorganic non-woven fibers or combinations thereof. Organic films such as polyimide film can also be used. An organic film is defined as a thin supporting material. Examples of fibers operable in this invention are E-glass (electrical grade glass), S-glass (high strength glass), quartz (quartz fabrics are woven from yarn produced from high purity crystalline $SiO_2$), low dielectric fabrics such as D-glass (low dielectric constant glass), aramids such as KEVLAR AND NOMEX polyaramides, (both registered trademarks of E.I. DuPont de Nemours and Co.), poly-p-phenylene benzobisthiazole, p-phenylene benzobisoxazole, polyetheretherketone, aromatic polyesters, polytetrafluoroethylene, and the like. Most preferably the fiber used is E-glass. The reinforcing material is preferably present in the range of about 22 percent to about 65 percent by weight of the dielectric layer.

As stated, the portion of the dielectric layer of this invention that contains the aforedefined resin material, coloring agent, and fluorescent material is comprised of the composition defined in detail above, although the quantities as a percentage of the total weight of the dielectric will differ as a direct result of the reinforcing material being an integral part of the dielectric layer. In such a layer, the resin material preferably comprises from about 27 percent to about 78 percent by weight of the dielectric layer. The coloring agent in turn comprises about 0.003 percent to about 8 percent by weight of the dielectric layer, and the fluorescing agent comprises about 0.003 percent to about 9 percent by weight of the dielectric layer.

In accordance with yet another embodiment of this invention, a method for making the composition defined above is hereby provided. The method comprises the steps of providing a first quantity of resin material, adding to the resin material a second quantity of fluorescing agent, adding to the resin material a third quantity of coloring agent, and blending the resin material. Providing a first quantity of resin material includes adding a quantity of an epoxy, cyanate, or bismaleimide resin or combinations thereof to a sting solvent such as methyl ethyl ketone (MEK) and thereby dissolving the resin in the solvent. A UV light absorbing fluorescing agent, such as one from the group previously described, is then added to the mixture and is also dissolved.

Separately, a coloring agent such as an organic dye, an organic pigment, or an inorganic pigment or combinations thereof is added at room temperature to a stirring solvent, such as MEK, and the coloring agent is dissolved. A catalyst, present to promote crosslinking, is also added to the solution to form a preconcentrate. The preconcentrate is then added to the resin material and blended (i.e., stirred) to form a solubilized composition. The preferred catalysts utilized in this invention are metal carboxylates and metal chelates, such as cobalt, iron, zinc and copper acetylacetonate, octoates, or naphthenates.

Upon curing and baking to drive off the solvent, the composition of this invention is complete.

The invention is illustrated by the following examples which are not intended to be limiting:

EXAMPLE 1

A composition of the followings materials: Spectrasol Black RL (3.33 g), Bayer Macrolex Yellow 6G (0.33 g), Bayer Macrolex Blue RR (0.92 g) and Ciba AER 8018 (300 g), were added to a 4 liter (L) glass jar containing 642 g MEK and dissolved. This solution was added to a stirring mixture of Shell Epon 1031 (75.0 g of an 80% solution in MEK), Ciba Araldite LZ 9302 (839 g of a 71.5% solution in MEK) and Mitsubishi MGC 2060B (857 g of a 70% solution in MEK). The resultant resin solution had a solids content of about 57.5% and a dye concentration of about 0.30 % based on resin solids. The colored varnish solution was free of undissolved resin and dye. At least 15 minutes prior to impregnation, the solution was catalyzed by dissolving 0.04 phr zinc octanoate (0.62 g of an 18% solution in mineral oil) with vigorous stirring. 2116 style E-glass cloth supplied by Clark-Schwebel with a proprietary silane finish (CS-767) was impregnated on a laboratory scale treater with the resin varnish. The resin impregnated glass fiber cloths were baked for 3.5–4 minutes at 150° Celsius to remove MEK solvent and to B-stage cure the resin. B-stage cure resin impregnated glass fiber cloth is partially polymerized but not gelled cure and is herein after referred to as prepreg. Resin pick-up was about 47% to about 52%. Test specimens for determining the glass transition ($T_g$, coefficient of thermal expansion (CTE), thermal stability, copper peel strength, interlaminar bond strength, moisture absorption and dielectric constant were prepared by press lamination (200° C./1.5 hours/300 psi) of multiple prepreg layers with 0.0014 in. copper foil on both sides. The resulting laminates were uniformly black in color, had good optical contrast, and fluoresced when irradiated with UV light. Table 1 lists the properties of the laminates prepared from the formulation of this example. The values in TABLE 1 illustrate that the resulting laminates made from this formulation exhibit good typical physical results.

TABLE 1

| Property | Result | Test Method |
|---|---|---|
| $T_g$, ° C. | 211 | IPC-TM-650 (2.4.25C) |
| $T_d$(in air), ° C. | 326 | Thermogravimetric Analysis |
| CTE (x,y-axis), ppm | 16 | IPC-TM-650 (2.4.41) |
| CTE (z-axis), ppm | 56 | IPC-TM-650 (2.4.41) |
| Dielectric constant @ 1 GHz | 4.03 | Spectrum Analyzer |
| Dissipation Factor @ 1 MHz | 0.0064 | IPC-TM-650 (2.5.5.2) |
| Pressure Vessel Test, 1 h | Pass* | IPC-TM-650 (2.6.16) |
| Moisture uptake, % | | IPC-TM-650 (2.6.2.1) |

TABLE 1-continued

| Property | Result | Test Method |
|---|---|---|
| 24 h, rt | 0.19 | |
| 1 h, pressure vessel | 0.31 | |
| 16 h, boiling H$_2$O | 0.64 | |
| Copper bond, lb/in | 8.40 | IPC-TM-65O (2.4.9) |
| Interlaminar bond, lb/in | 2.97 | IPC-TM-650 (2.4.40) |

*Pass- meets criteria of referenced test methods IPC-TM-650 (2.6.16) and IPC-TM 650 (2.6.2.1)

EXAMPLE 2

A dye and catalyst pre-concentrate was prepared by combining Ciba Orasol Black RLI (1.41 kg), Bayer Macrolex Yellow 6G (0.18 kg), Bayer Macrolex Blue RR (0.39 kg), zinc octanoate (0.23 kg of an 18% solution in mineral oil) and MEK (92.1 kg) in a 55 gal steel drum equipped with an air-driven drum mixer. The pre-concentrate solution was continuously mixed at all times throughout the batch mixing process except during its transfer to the resin mix tank. Ciba Araldite LZ 9302 (144.8 kg), Mitsubishi MGC 2060B (118.4 kg) and Shell Epon 1031 (15.8 kg) were sequentially pumped into a large capacity mix tank with a mechanically driven impeller. The dye and catalyst pre-concentrate solution (28.6 kg) was pumped into the mix tank and the varnish was transferred to a holding tank. This sequential process of resin and pre-concentrate addition to the holding tank was repeated two more times until the total quantity of varnish in the holding tank was 837 kg. The varnish was sampled and a gel time of 220 seconds was determined by the stroke cure method. The varnish was pumped to a large capacity pan with circulators. The specific gravity of the varnish in the mixpan was maintained by addition of MEK as necessary. A web of 2116 style E-glass cloth with a proprietary silane finish (CS-767) supplied by Clark-Schwebel was passed through a gap from 0.010–0.012 inches at a web speed of 8 to 12 meters per minute and zone temperatures of about 130° C. to about 165° C. The B-staged prepreg had a resin pick-up of about 49% to about 51%. Test specimens for determining the glass transition (T$_g$), coefficient of thermal expansion (CTE), thermal stability, copper peel strength, interlaminar bond strength, moisture absorption and dielectric constant were prepared by press lamination (200° C./1.5 hours/300 psi) of multiple prepreg layers with 0.0014 in. copper foil on both sides. The resulting laminates were uniformly black in color, had good optical contrast, and fluoresced when irradiated with UV light. Table 2 lists the properties of the laminate prepared from the formulation of this example. The values in Table 2 illustrate that the laminate made from this formulation in a large scale apparatus exhibit good typical physical results.

TABLE 2

| Property | Result | Test Method |
|---|---|---|
| T$_g$, ° C. | 213 | IPC-TM-650 (2.4.25C) |
| T$_d$ (in air), ° C. | 330 | Thermogravimetric Analysis |
| CTE (x,y-axis), ppm | 15 | IPC-TM-650 (2.4.41) |
| CTE (z-axis), ppm | 47 | IPC-TM-650 (2.4.41) |
| Dielectric constant @ GHz | 3.79 | Spectrum Analyzer |
| Dissipation Factor @ 1 MHz | 0.0080 | IPC-TM-650 (2.5.5.2) |
| Pressure Vessel Test, 7.5 h | Pass | IPC-TM-650 (2.6.16) |
| Moisture uptake, % | | IPC-TM-650 (2.6.2.1) |
| 24 h, rt | 0.2 | |
| 1 h, pressure vessel | 0.33 | |
| 16 h, boiling H$_2$O | 0.71 | |
| Copper bond, lb/in | 8.55 | IPC-TM-650 (2.4.9) |
| Interlaminar bond, lb/in | 2.70 | IPC-TM-650 (2.4.40) |

While there have been shown and described what are at present considered the preferred embodiments of the invention, it will be obvious to those skilled in the art that various changes and modifications may be made therein without departing from the scope of the invention as defined by the appended claims.

What is claimed is:

1. An electronic package comprising a dielectric layer and at least one conductive layer positioned on or within said dielectric layer, said dielectric layer including a composition of reinforcing material, a resin material, a coloring agent, and a fluorescing agent;

wherein said resin material is selected from the group consisting of epoxy, cyanate, and bismaleimide resins; and wherein said epoxy polymer resin comprises epoxides derived from mononuclear and polynucleur dihydric phenols, said cyanate resin comprising a polyfunctional cyanate ester monomer or prepolymer having the formula R—(—O—C N)$_m$, where m=2–5 and R is an aromatic organic group, the cyanate groups being bonded to an aromatic ring of said aromatic organic group; and wherein said bismaleimide resin comprises a polyfunctional maleimide resin selected from the group consisting of 1,3- or 1,4-dimaleimide benzene,
   1,3- or 1,4-bis(maleimide methylene)benzene, 1,3- or 1,4-dimaleimide
   cyclohexane, 1,3- or 1,4-bis(maleimide methylene) cyclohexane,
   4,4'-dimaleimide biphenyl, bis(4-maleimidephenyl) methane,
   bis(4-maleimidephenyl)ether, bis(4-maleimidephenyl sulfone,
   bis(4-maleimide-3-methylphenyl)methane,
   bis(4-maleimide-3-chlorophenyl)methane,
   bis(4-maleimide-3,5-dimethyl phenyl)methane,
   2,2'-bis(4-maleimide-3-methylphenyl)propane,
   2,2'-bis(4-maleimide-3,5-dibromophenyl)propane,
   bis(4-maleimidephenyl)phenylmethane,
   3,4-dimaleimidephenyl-4'-maleimidephenylmethane,
   1,1'-bis(4-maleimide-phenyl)-1-phenylmethane, and maleimide.

2. The electronic package of claim 1 wherein said conductive layer comprises an electrically conductive material.

3. The electronic package of claim 2, wherein said electrically conductive material is copper.

4. The electronic package of claim 3, wherein said copper layer is in the form of a circuitized pattern.

5. The electronic package of claim 1, wherein said reinforcing material is selected from the group consisting of organic woven fibers, organic non-woven fibers, inorganic woven fibers, and inorganic non-woven fibers.

6. The electronic package of claim 5, wherein said reinforcing material is about 22 percent to about 65 percent by weight of said dielectric layer.

7. The electronic package of claim 1, wherein said resin material is said epoxy resin.

8. The electronic package of claim 1, wherein said resin material is said cyanate resin.

9. The electronic package of claim 1, wherein said resin material is said bismaleimide resin.

10. The electronic package of claim 1, wherein said resin material comprises from about 27 percent to about 78 percent by weight of said dielectric layer.

11. The electronic package of claim 1, wherein said coloring agent is selected from the group consisting of organic dyes, organic pigments, and inorganic pigments.

12. The electronic package of claim 11, wherein said coloring agent comprises from about 0.003 percent to about 8 percent by weight of said dielectric layer.

13. The electronic package of claim 1, wherein said fluorescing agent comprises a UV absorbing compound with enhanced fluorescent characteristics.

14. The electronic package of claim 13, wherein said UV absorbing compound is selected from the group consisting of tetrafunctional epoxy resins, benzoxazoles, pyrazolines, stilbenes, and aminocoumarins.

15. The electronic package of claim 1, wherein said UV absorbing compound comprises from about 0.003 percent to about 9 percent by weight of said dielectric layer.

* * * * *

UNITED STATES PATENT AND TRADEMARK OFFICE
CERTIFICATE OF CORRECTION

PATENT NO. : 6,190,759 B1  
DATED : February 20, 2001  
INVENTOR(S) : Gary Johansson et al.

It is certified that error appears in the above-identified patent and that said Letters Patent is hereby corrected as shown below:

Claim 15,
Line 1, "claim 1" should read -- claim 14 --.

Signed and Sealed this

Eighteenth Day of December, 2001

Attest:

Attesting Officer

JAMES E. ROGAN
Director of the United States Patent and Trademark Office